United States Patent
Katagiri et al.

(10) Patent No.: US 8,710,672 B2
(45) Date of Patent: Apr. 29, 2014

(54) SEMICONDUCTOR DEVICE AND METHOD OF MANUFACTURING THE SAME

(75) Inventors: Masayuki Katagiri, Kanagawa (JP); Yuichi Yamazaki, Tokyo (JP); Makoto Wada, Kanagawa (JP); Tadashi Sakai, Kanagawa (JP); Naoshi Sakuma, Kanagawa (JP); Mariko Suzuki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 4 days.

(21) Appl. No.: 13/541,954

(22) Filed: Jul. 5, 2012

(65) Prior Publication Data

US 2013/0075929 A1 Mar. 28, 2013

(30) Foreign Application Priority Data

Sep. 27, 2011 (JP) ................. 2011-210972

(51) Int. Cl.
*H01L 21/768* (2006.01)

(52) U.S. Cl.
USPC .... 257/774; 257/751; 257/773; 257/E21.577; 257/E23.145; 438/637; 438/629; 438/639

(58) Field of Classification Search
USPC .......... 257/774, E23.145, E21.577, 751, 773, 257/750; 438/637, 629, 639; 977/742, 734, 977/842

See application file for complete search history.

(56) References Cited

U.S. PATENT DOCUMENTS

2009/0293273 A1* 12/2009 Keyser ........................... 29/874
2010/0209704 A1   8/2010 Yamazaki et al.
2011/0101528 A1   5/2011 Akimoto et al.

FOREIGN PATENT DOCUMENTS

JP    2009-70911      4/2009
JP    2010-163331 A   7/2010
JP    2011-96980 A    5/2011

OTHER PUBLICATIONS

Office Action issued Jul. 2, 2013, in Japanese Patent Application No. 2011-210972 (with English-language translation).

* cited by examiner

*Primary Examiner* — Thinh T Nguyen
(74) *Attorney, Agent, or Firm* — Oblon, Spivak, McClelland, Maier & Neustadt, L.L.P.

(57) ABSTRACT

A semiconductor device of an embodiment includes: a substrate; a first catalytic metal film on the substrate; graphene on the first catalytic metal film; an interlayer insulating film on the graphene; a contact hole penetrating through the interlayer insulating film; a conductive film at the bottom portion of the contact hole, the conductive film being electrically connected to the graphene; a second catalytic metal film on the conductive film, the second catalytic metal film being subjected to plasma processing with at least one kind of gas selected from hydrogen, nitrogen, ammonia, and rare gas; and carbon nanotubes on the second catalytic metal film.

4 Claims, 7 Drawing Sheets

SEMICONDUCTOR DEVICE AND METHOD OF MANUFACTURING THE SAME

CROSS-REFERENCE TO RELATED APPLICATION

This application is based upon and claims the benefit of priority from Japanese Patent Applications No. 2011-210972, filed on Sep. 27, 2011; the entire contents of which are incorporated herein by reference.

FIELD

Embodiments described herein relate generally to a semiconductor device and a method of manufacturing the semiconductor device.

BACKGROUND

As LSI circuits and 3D memories have been becoming smaller in size with more layers, increases in interconnect delay in metal interconnects have become a serious problem. To reduce interconnect delay, it is essential to reduce the interconnect resistance and the capacitance between interconnects. To lower the resistance of interconnects, a low-resistance material such as Cu has been used in practice. With Cu interconnects, however, there are problems such as reliability degradation due to stress migration or electromigration, and increases in electrical resistivity due to size effects. Therefore, there is an increasing demand for interconnect materials with a low resistance and a high current density tolerance.

As the next-generation interconnect materials to achieve a lower resistance and higher reliability, attention is being paid to application of carbon-based materials such as carbon nanotubes or graphene having excellent physical properties such as a high current density tolerance, high electrical conductivity, and high heat conductivity. Particularly, structures having carbon nanotubes arranged as vertical interlayer interconnects and graphene as horizontal interconnects have been studied.

In a case where a graphene layer as a horizontal interconnect has a multilayer structure, however, only the uppermost layer in the multilayer graphene layer is in contact with the carbon nanotube catalyst/a foundation layer at the bottom portion of a contact hole. The resistance between graphene layers is a hundred or more times higher than the graphene bulk resistance. Therefore, there is a possibility that only the conduction through the uppermost layer can be used.

DETAILED DESCRIPTION

Figure 1:
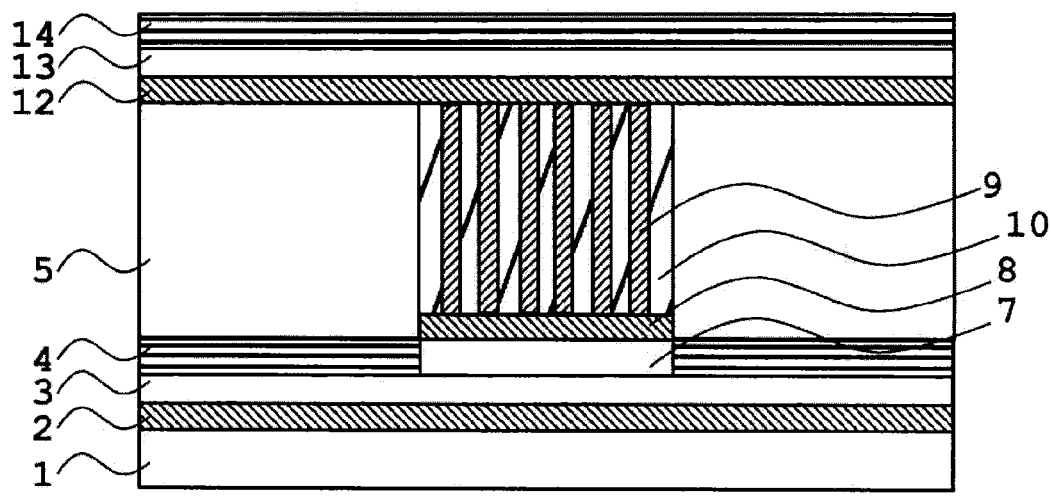
FIG. 1 is a cross-sectional structural view of a first embodiment.

A semiconductor device of an embodiment includes: a substrate; a first catalytic metal film on the substrate; graphene on the first catalytic metal film; an interlayer insulating film on the graphene; a contact hole penetrating through the interlayer insulating film; a conductive film at the bottom portion of the contact hole, the conductive film being electrically connected to the graphene; a second catalytic metal film on the conductive film, the second catalytic metal film being subjected to plasma processing with at least one kind of gas selected from hydrogen, nitrogen, ammonia, and rare gas; and carbon nanotubes on the second catalytic metal film.

Embodiments of the invention will be described below with reference to the drawings.

The following is a description of embodiments, with reference to the accompanying drawings. The embodiments are merely examples, and the scope of the invention is not limited to them. The drawings show examples, and are plotted symmetrically. The same reference numerals are not shown more than once. The shapes, sizes, numbers in the drawings are not necessarily equivalent to those in an actual semiconductor device.

First Embodiment

FIG. 1 is a cross-sectional structural view of the interlayer interconnect portion of a semiconductor device according to a first embodiment, and is a cross-sectional view of the portion including interlayer interconnects of the semiconductor device according to the fundamental embodiment. The semiconductor device of this embodiment characteristically includes: a substrate; a first catalytic metal film on the substrate; graphene on the first catalytic metal film; an interlayer insulating film on the graphene; a contact hole penetrating through the interlayer insulating film; a conductive film at the bottom portion of the contact hole, the conductive film being electrically connected to the graphene; a second catalytic metal film on the conductive film, the second catalytic metal film being subjected to plasma processing with at least one kind of gas selected from hydrogen, nitrogen, ammonia, and rare gas; and carbon nanotubes on the second catalytic metal film.

A method of manufacturing the semiconductor device of the first embodiment characteristically includes: forming a first catalytic metal film on a substrate; forming graphene on the first catalytic metal film; forming an interlayer insulating film on the graphene; forming a contact hole penetrating through the interlayer insulating film; removing the portion of the graphene existing in the contact hole; forming a conductive film at the bottom portion of the contact hole; forming a second catalytic metal film on the conductive film; subjecting the second catalytic metal film to plasma processing with at least one kind of gas selected from hydrogen, nitrogen, ammonia, and rare gas; forming carbon nanotubes on the second catalytic metal film subjected to the plasma processing; forming a buried film between the carbon nanotubes; flattening the carbon nanotubes and the buried film; and forming an upper interconnect layer on the flattened carbon nanotubes and the flattened interlayer insulating film.

The semiconductor device may be a semiconductor device including interlayer interconnects, such as a LSI circuit or a 3D memory. In the cross-sectional structural view of FIG. 1, a foundation layer 2 is formed on a substrate 1 having a semiconductor integrated circuit or the like formed therein. A first catalytic metal film 3 that is a catalyst for growing graphene is formed on the foundation layer 2. Graphene 4 grown from the catalytic metal film 3 and a conductive film 7 electrically connected to the graphene 4 are formed on the first catalytic metal film 3. An interlayer insulating film 5 is formed on the graphene 4. A contact hole for forming interlayer interconnects is formed above the conductive film 7. A second catalytic metal film 8 that is a catalytic film for growing carbon nanotubes is formed on the conductive layer 7. Carbon nanotubes 9 penetrating through the contact hole are formed on the second catalytic metal film 8. A buried film 10 is formed in the region where the carbon nanotubes 9 are not formed in the contact hole. The carbon nanotubes 9 are connected to a foundation layer 12 that is an upper interconnect layer formed on the interlayer insulating film 5 and the buried film 10. A first catalytic metal film 13 is formed on the foundation layer 12. Graphene 14 is formed on the first catalytic metal film 13.

The foundation layers 2 and 12 may not be provided. Where the foundation layers 2 and 12 are not provided, the carbon nanotubes 9 should be connected to the first catalytic metal film 13 as the upper interconnect layer. The interlayer interconnects of this embodiment have the components with reference numerals 3 through 10 as one structural unit. The structural unit is repeatedly provided, to form the interlayer interconnects of the multilayer substrate. Although denoted by different reference numerals, each pair of the foundation layers 2 and 12, the first catalytic metal films 3 and 13, and the graphene 4 and 14 have the same structures. Therefore, explanation of the components with the greater reference numerals may not be made in the following description.

Referring now to the process diagrams of FIGS. 2 through 9, the manufacturing procedures of the first embodiment are described.

Figure 2:
FIG. 2 is a process diagram illustrating formation of a foundation layer and formation of a first catalytic metal film in the first embodiment.

FIG. 2 is a diagram illustrating the procedure for forming a foundation layer and a catalytic metal film of the first embodiment. First, the foundation layer 2 and the catalytic metal film 3 are formed on the foundation substrate 1 having a semiconductor integrated circuit or the like formed therein. Although not shown, an interlayer insulating film may be formed between the substrate 1 and the foundation layer 2. The method of forming the foundation layer 2 and the catalytic metal film 3 may be a film forming method such as PVD (Physical Vapor Deposition) or CVD (Chemical Vapor Deposition).

The foundation layer 2 may not be provided. The foundation layer 2 is preferably used below the catalytic metal film 3, to stabilize and improve the conductivity of the interlayer interconnects. The thickness of the foundation layer 2 is not smaller than 0.5 nm and not greater than 10 nm, for example. The foundation layer 2 is preferably made of a metal serving as a promoter metal for carbon nanotube growth or graphene growth. Here, the foundation layer 2 may have a structure formed by stacking different conductive materials. A metal film can be used as the foundation layer 2. For those reasons, the foundation layer 2 is preferably a metal film containing at least one element selected from the group including Ti, Ta, Mn, Mo, and V. Further, for those reasons, the foundation layer 2 is more preferably a metal film formed with at least one element selected from the group including Ti, Ta, Mn, Mo, and V, and an unavoidable element.

The first catalytic metal film 3 is preferably a film containing an element from which graphene can grow. For that reason, it is preferable to use a metal film containing at least one element selected from the group including Co, Ni, Fe, Ru, and Cu. Further, for that reason, it is preferable to use a metal film formed with at least one element selected from the group including Co, Ni, Fe, Ru, and Cu, and an unavoidable element. The thickness of the catalytic metal film 3 is not smaller than 1 nm and not greater than 100 nm, for example. The catalytic metal film 3 is preferably a continuous film, for the growth of the graphene 4 with a large area. A continuous film is a film without any discontinuities. In forming the continuous film of the catalytic metal film 3, it is preferable to form a film by PVD or CVD. The graphene generated on the catalytic metal film 3 can be checked with a cross-section TEM (Transmission Electronic Microscope) observation. The fact that the graphene 4 has a multilayer structure can also be checked through the cross-section TEM observation.

Figure 3:
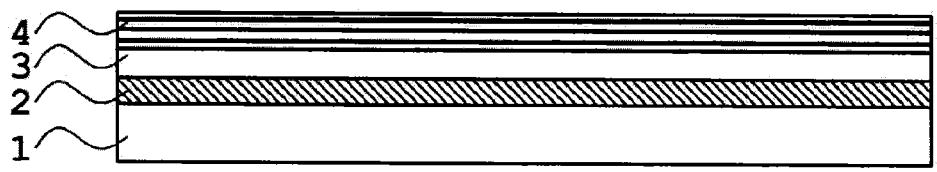
FIG. 3 is a process diagram illustrating growth of graphene in the first embodiment.

As shown in the process diagram of FIG. 3, the graphene 4 is grown from the entire surface of the substrate on which the catalytic metal film 3 is formed. The method of growing the graphene 4 may be thermal CVD or plasma CVD, for example. In a case where plasma CVD is used, for example, the substrate is heated in a reacting furnace. A hydrocarbon-based gas such as methane gas, ethane gas, propane gas, or acetylene gas is introduced as a raw material gas, and hydrogen is introduced as a carrier gas. For example, methane gas is excited and discharged by microwaves, so that the raw material gas turns into plasma and reacts with the catalytic metal film 3. In this manner, the graphene 4 having a multilayer structure with two or more layers is grown. The processing temperature in growing the graphene is preferably not lower than 200° C. and not higher than 1000° C. More preferably, the processing temperature is approximately 500° C. At a lower temperature than 200° C., graphene with sufficiently high quality cannot be obtained. The above processing temperature is highly compatible with the LSI manufacturing process.

Figure 4:
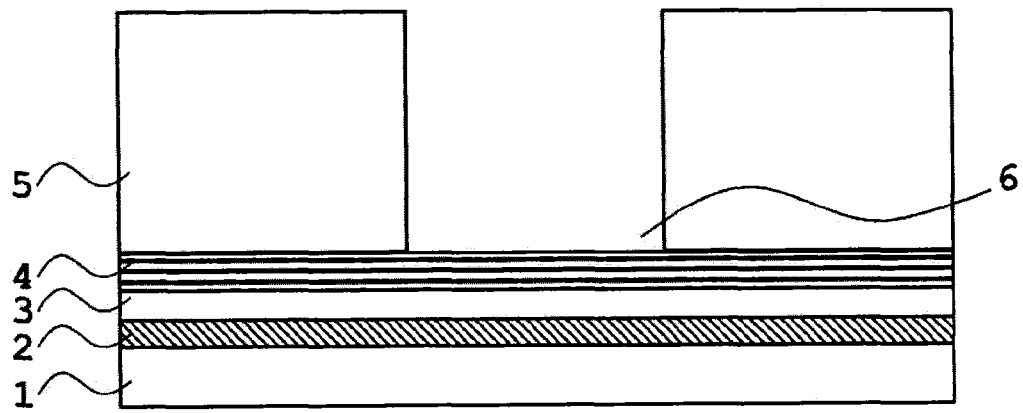
FIG. 4 is a process diagram illustrating formation of an interlayer insulating film and formation of a contact hole in the first embodiment.

As shown in the process diagram of FIG. 4, the interlayer insulating film 5 that is a low-permittivity insulating film such as a SiOC film is formed. Dry etching using a fluorine-based gas is then performed, for example, so that the contact hole 6 is formed to penetrate through the interlayer insulating film 5 and reach the graphene 4. A protection layer (not shown) is preferably formed between the graphene 4 and the interlayer insulating film 5, to prevent process damage to the graphene 4 during the formation of the interlayer insulating film 5. The protection layer may be a metal film, for example. Alternatively, the interlayer insulating film 5 may have a stack structure such as an etching stop film formed with an insulting film such as a SiCN film.

Figure 5:
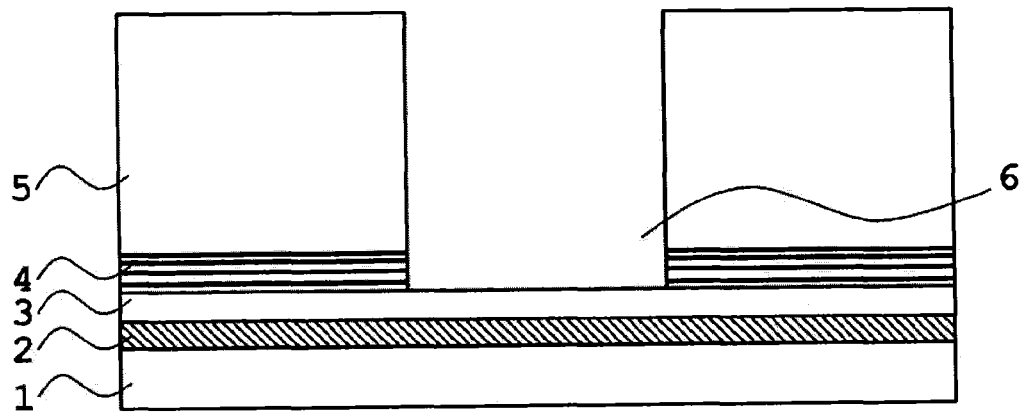
FIG. 5 is a process diagram illustrating graphene etching in the first embodiment.

As shown in the process diagram of FIG. 5, the portion of the graphene 4 located at the bottom of the contact hole 6 is removed by dry etching using an oxygen-based gas, for example.

Figure 6:
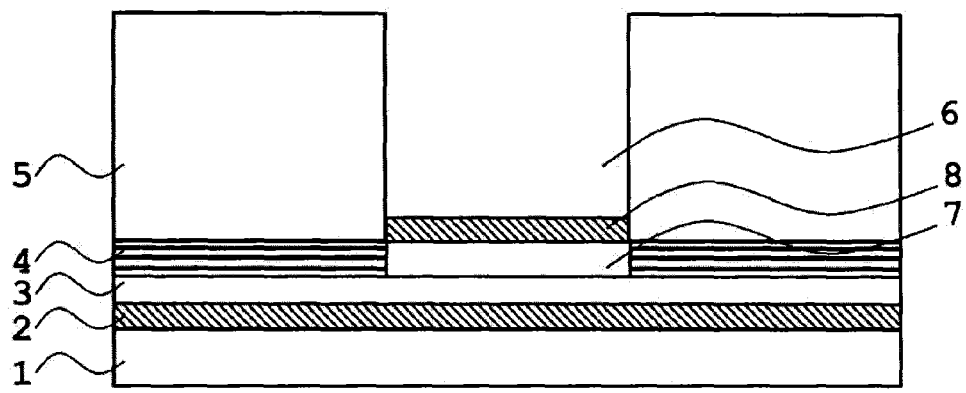
FIG. 6 is a process diagram illustrating formation of a conductive film and formation of a second catalytic metal film in the first embodiment.

The process diagram of FIG. 6 is a diagram illustrating the formation of the conductive film 7 and the second catalytic metal film 8 of the first embodiment. In this description, a case where the conductive film 7 and the second catalytic metal film 8 are selectively formed on the bottom of the contact hole 6 is described. The conductive film 7 is preferably a metal film containing a metal such as Ti, Ta, or W, which forms a carbide at the interface with the graphene 4, or a metal film formed with at least one of those metals and an unavoidable element. Alternatively, the conductive film 7 may be a metal film containing a metal such as Co, Ni, Pd, or Ru, which has catalysis, or may be a metal film formed with at least one of those metals and an unavoidable element. Further, the conductive film 7 preferably includes both metal films. In view of this, the conductive film 7 is preferably a metal film containing at least one metal selected from the group including Ti, Ta, W, Co, Ni, Pd, and Ru, or a metal film formed with at least one metal selected from the group including Ti, Ta, W, Co, Ni, Pd, and Ru, and an unavoidable element. The conductive film 7 may also contain an alloy. The conductive film 7 is formed so that the side surfaces thereof are in contact with the multilayer graphene 4. The carbide at the interface between the conductive film 7 and the graphene 4 is formed at the time of the growth of the carbon nanotubes 9. Alternatively, the carbide at the interface between the conductive film 7 and the graphene 4 can be generated by annealing. The carbide may be TiC, TaC, or WC, for example. The thickness of the conductive film 7 is at least 1 nm or greater, and is preferably equal to or greater than the thickness of the multilayer graphene 4. As many graphene layers are in contact with the conductive film 7 and are in a conductive state, the resistance of the semiconductor device including interlayer interconnects of this embodiment can be lowered.

The carbide generated at the interface between the conductive film 7 and the graphene 4 is TiC, TaC, WC, or the like, and the carbide formation can be checked by EELS (Electron Energy-Loss Spectroscopy).

The second catalytic metal film 8 is preferably a film containing an element from which carbon nanotubes can grow. For that reason, it is preferable to use a metal film containing at least one element selected from the group including Co, Ni, Fe, Ru, and Cu. Further, for that reason, it is preferable to use a metal film formed with at least one element selected from the group including Co, Ni, Fe, Ru, and Cu, and an unavoidable element. The thickness of the catalytic metal film 8 is not smaller than 1 nm and not greater than 100 nm, for example.

Microparticulation of the catalytic metal film 8 is preferable for the growth of the carbon nanotubes 9. For microparticulation of the catalytic metal film 8, the thickness of the catalytic metal film 8 is preferably not smaller than 1 nm and not greater than 20 nm, for example. The carbon nanotubes 9 formed on the catalytic metal film 8 can be checked by cross-section TEM (Transmission Electron Microscope) observation.

For the carbon nanotube growth, the second catalytic metal film 8 is microparticulated by plasma surface processing. The raw material gas of the plasma is preferably hydrogen, nitrogen, ammonia, or rare gas such as argon, for example. Alternatively, the raw material gas may be a mixed gas containing at least two or more of the above. Therefore, the plasma used in the microparticulation of the second catalytic metal film 8 is one or more gases that are selected from hydrogen, nitrogen, ammonia, and rare gas, and are turned into plasma. The microparticulation is preferably performed with plasma such as microwave-excited plasma. Although depending on the thickness of the catalytic metal film, the plasma processing is preferably performed at a temperature that is not lower than room temperature (25° C.) and not higher than 500° C. for a period of time that is not shorter than one minute and not longer than 30 minutes. At this point, substrate heating may be performed. After the microparticulation, the substrate heating may be performed in a non-oxide atmosphere or in vacuum. By the heating after the microparticulation, the metal of the conductive film 7 and the metal of the catalytic metal film 8 functioning as carbon nanotube growth promoters are preferably turned into an alloy through interdiffusion. The mean particle size of the fine particles is preferably not smaller than 1 nm and not larger than 20 nm, so as to achieve growth of carbon nanotubes with high density and excellent orientation.

Figure 7:
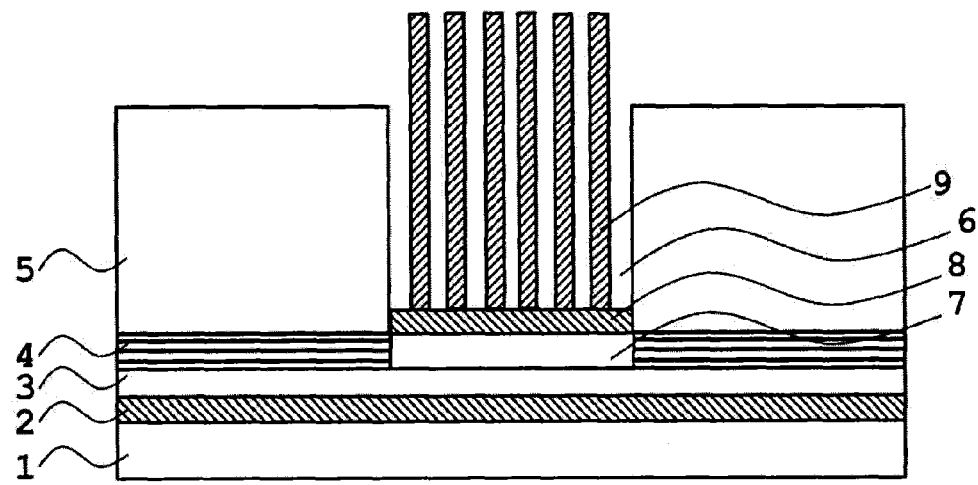
FIG. 7 is a process diagram illustrating growth of carbon nanotubes in the first embodiment.

As shown in the process diagram of FIG. 7 illustrating the procedure for growing the carbon nanotubes of the first embodiment, a hydrocarbon-based gas such as methane gas, ethane gas, propane gas, or acetylene gas is introduced as a raw material gas into the reacting furnace, and hydrogen is introduced as a carrier gas into the reacting furnace. The hydrocarbon-based gas is excited and discharged by microwaves, so that the raw material gas is turned into plasma. Using the microparticulated catalyst (the catalytic metal film 8 subjected to plasma processing with hydrogen gas, nitrogen gas, ammonia gas, or rare gas), methane that has been turned into plasma is made to react, so that the carbon nanotubes 9 are grown. The processing temperature in growing the carbon nanotubes 9 is preferably not lower than 200° C. and not higher than 1000° C. More preferably, the processing temperature is approximately 500° C. At a lower temperature than 200° C., carbon nanotubes with sufficiently high quality cannot be obtained. The above processing temperature is highly compatible with the LSI manufacturing process.

Figure 8:
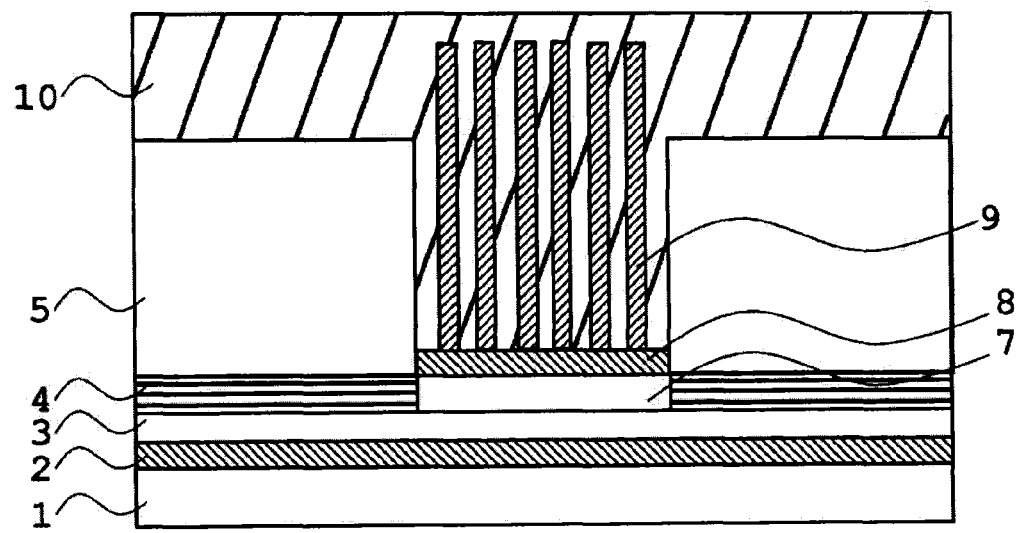
FIG. 8 is a process diagram illustrating formation of a buried film in the first embodiment.

The process diagram of FIG. 8 is a diagram illustrating the procedure for forming the buried film of the first embodiment. The buried film 10 is formed to secure the carbon nanotubes 9 so that better polishing can be performed at the time of flattening and polishing by CMP (Chemical Mechanical Polishing). The buried film 10 may be made of an insulating material or a conductive material. In a case where an insulating material is used as the buried film 10, a SOD (Spin On Dielectric) that is a coating insulating film is formed by spin coating, for example. After the spin coating, the insulating film is hardened at 400° C., for example. In a case where a conductive material is used as the buried film 10, a Cu film is formed by electrolytic plating, for example. As a conductive material is used as the buried film 10, the resistance of the interconnect portion can be lowered.

Figure 9:
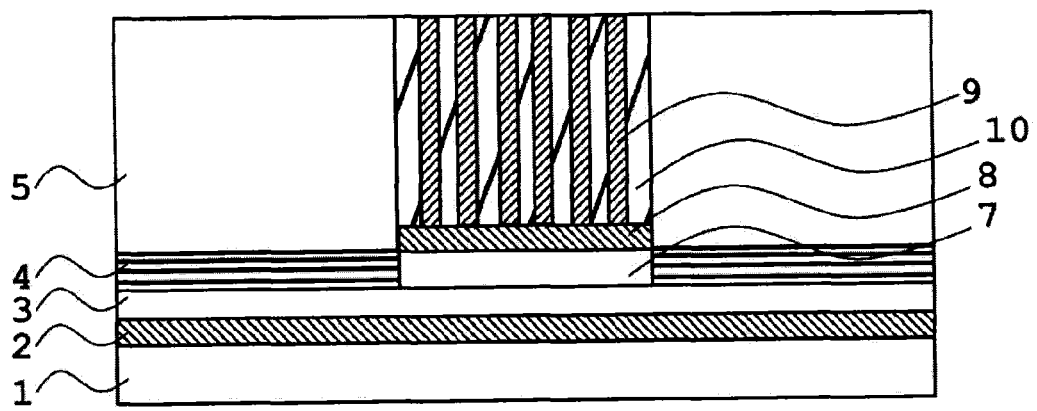
FIG. 9 is a process diagram illustrating flattening in the first embodiment.

As shown in the process diagram of FIG. 9, polishing is performed by CMP, to remove extra portions of the carbon nanotubes 9 and the buried film 10 outside the contact hole 6. In this manner, the interconnect structure having the carbon nanotubes 9 and the buried film 10 left only in the contact hole 6 can be formed.

The foundation layer 12, the first catalytic metal film 13, and the graphene 14 are then formed on the carbon nanotubes 9 and the buried film 10, and the procedures illustrated in FIGS. 3 through 9 are repeated. As a result, a semiconductor device having a multilayer interconnect structure including graphene and carbon nanotubes as shown in FIG. 1 is formed.

Second Embodiment

Figure 10:
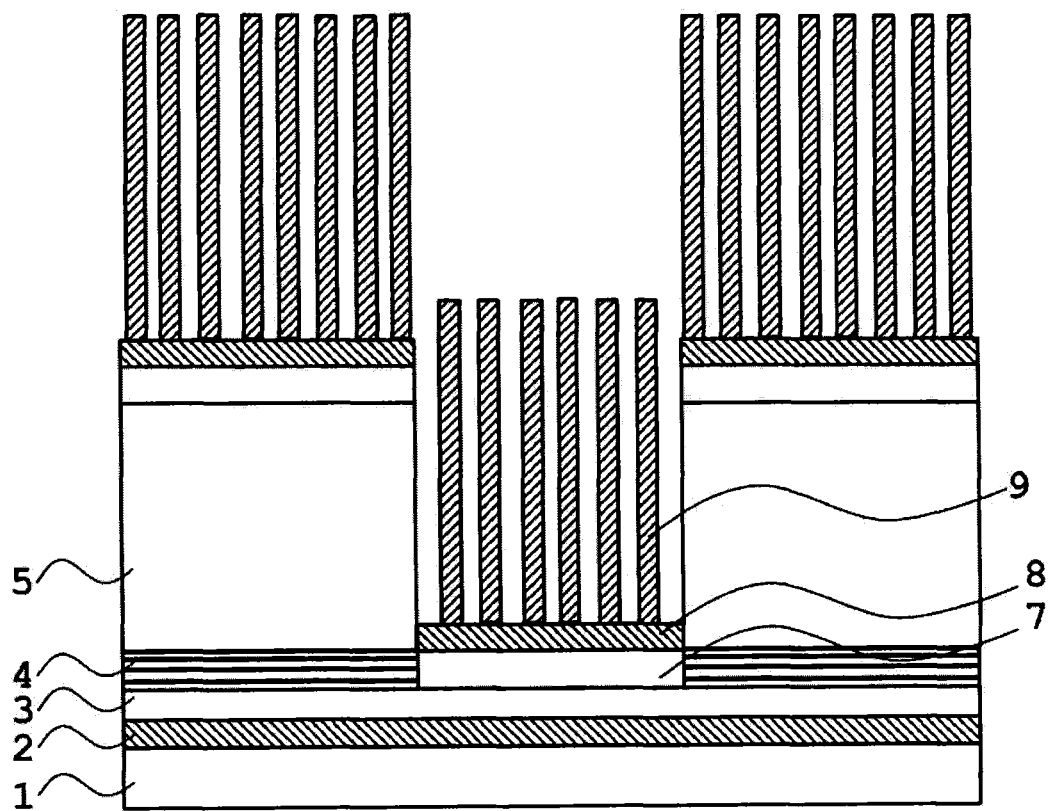
FIG. 10 is a process diagram illustrating growth of carbon nanotubes in a second embodiment.
Figure 11:
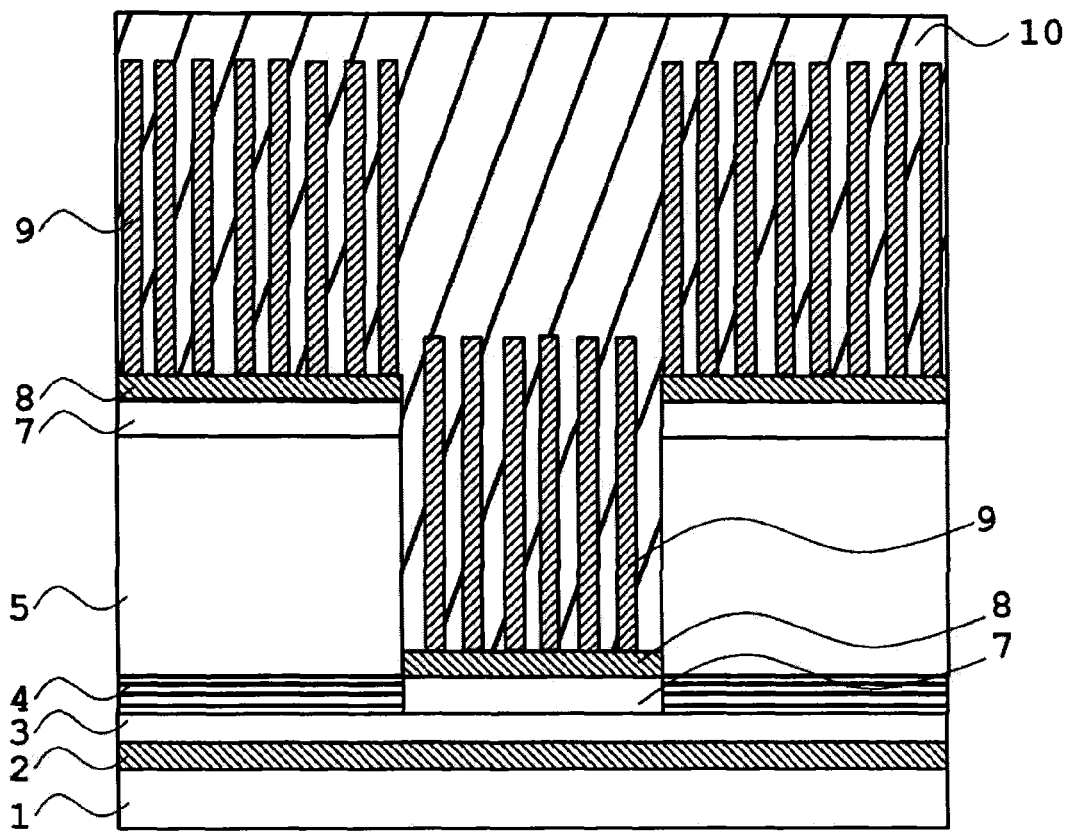
FIG. 11 is a process diagram illustrating formation of a buried film in the second embodiment.

Referring now to process diagrams of FIGS. 10 and 11, a method of manufacturing a semiconductor device according to a second embodiment is described. The second embodiment is the same as the first embodiment, except for the following. As shown in the conceptual diagram of the semiconductor device in FIG. 10, a conductive film 7 and a second catalytic metal film 8 for carbon nanotube growth are formed on the entire surface of the substrate, which differs from the structure shown in FIG. 6. In the second embodiment, the procedure for selectively forming a catalytic metal film at the bottom of the contact hole can be omitted, and the manufacturing process can be simplified. Carbon nanotubes 9 are then grown by plasma CVD, for example. As shown in FIG. 11, a buried film 10 is formed by CVD or spin coating of a SOD as a coating insulating film. To remove the extra portions of the carbon nanotubes 9 and the buried film 10 outside the contact hole, flattening is performed by CMP. In this manner, the interconnect structure shown in FIG. 9 is formed. A foundation layer 12, a first catalytic metal film 13, and graphene 14 are then formed on the carbon nanotubes 9 and the buried film 10. As a result, a semiconductor device having a multilayer interconnect structure including graphene and carbon nanotubes as shown in FIG. 1 is formed.

It should be noted that, although some of the interconnects are not shown in FIGS. 10 and 11, carbon nanotube interconnects exist in the vertical direction and graphene layers are formed in the horizontal direction in those interlayer interconnects.

Third Embodiment

Figure 12:
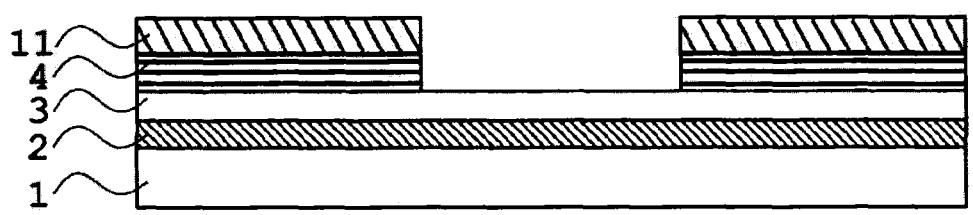
FIG. 12 is a process diagram illustrating formation of an etching resist and patterning in a third embodiment.
Figure 13:
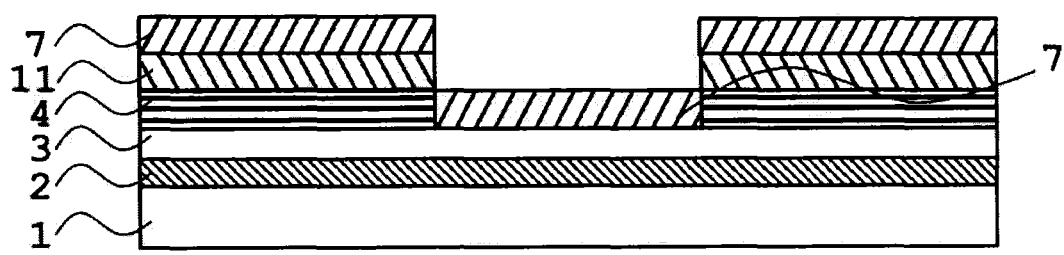
FIG. 13 is a process diagram illustrating formation of a conductive film in the third embodiment.
Figure 14:
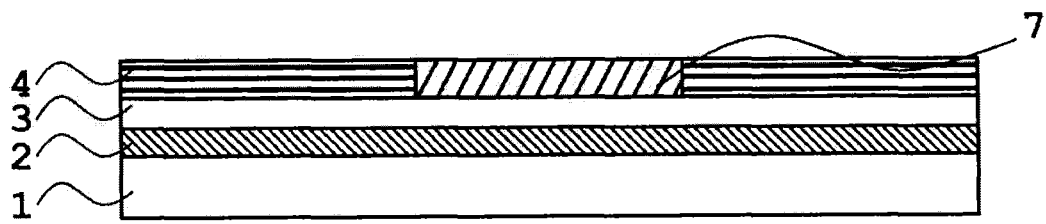
FIG. 14 is a process diagram illustrating removal of the conductive film in the third embodiment.

Referring now to process diagrams of FIGS. 12 through 14, a method of manufacturing a semiconductor device according to a third embodiment is described. The procedures from the initial procedure to the graphene growing procedure illustrated in FIG. 3 are the same as those according to the method of manufacturing the semiconductor device of the first embodiment. A resist 11 is applied to graphene 4, and patterning is performed on a contact hole formation region. As shown in FIG. 12, dry etching using an oxygen-based gas, for example, is performed, to remove part of the graphene 4. As shown in FIG. 13, a conductive film 7 is formed on the entire surface of the substrate. The resist 11 and the portions of the conductive film 7 outside the contact hole formation region are removed, to form the structure shown in FIG. 14. An interlayer insulating film 5 and a contact hole 6 are then formed, and a metal catalyst for carbon nanotube growth is formed. Carbon nanotubes 9 are then grown, to form the structure shown in FIG. 7. In the third embodiment, the conductive film 7 functioning as a promoter of carbon nanotube growth can be selectively formed at the bottom of the contact hole 6, and the carbon nanotubes 9 can be selectively grown from the contact hole bottom, regardless of whether the metal catalyst for carbon nanotube growth is formed on the entire surface of the substrate or is selectively formed only at the bottom of the contact hole 6.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a substrate;
    a first catalytic metal film on the substrate;
    graphene on the first catalytic metal film;
    an interlayer insulating film on the graphene;
    a contact hole penetrating through the interlayer insulating film;
    a conductive film at a bottom portion of the contact hole, the conductive film being electrically connected to the graphene;
    a second catalytic metal film on the conductive film, the second catalytic metal film being subjected to plasma processing with at least one kind of gas selected from hydrogen, nitrogen, ammonia, and rare gas; and
    carbon nanotubes on the second catalytic metal film.

2. The device according to claim 1, wherein the graphene has a multilayer structure including at least two layers.

3. The device according to claim 1, wherein
    the conductive film contains at least one element selected from the group including Ti, Ta, and W, and
    a carbide of the at least one element is formed at an interface between the graphene and the conductive film.

4. The device according to claim 1, further comprising a foundation layer formed between the substrate and the first catalytic metal film, the foundation layer containing at least one element selected from the group including Ti, Ta, Mn, Mo, and V.

* * * * *